(12) United States Patent
Ferland et al.

(10) Patent No.: US 7,293,354 B2
(45) Date of Patent: Nov. 13, 2007

(54) APPARATUS FOR MOUNTING COLUMNS FOR GRID ARRAY ELECTRONIC PACKAGES

(75) Inventors: Yvan Ferland, Quebec (CA); Stephane Harel, Quebec (CA); Isabel De Sousa, Quebec (CA)

(73) Assignee: International Business Machines Corporation, Armonk, NY (US)

( * ) Notice: Subject to any disclaimer, the term of this patent is extended or adjusted under 35 U.S.C. 154(b) by 384 days.

(21) Appl. No.: 10/904,851

(22) Filed: Dec. 1, 2004

(65) Prior Publication Data

US 2005/0122126 A1   Jun. 9, 2005

(30) Foreign Application Priority Data

Dec. 3, 2003   (CA) .................................. 2451951

(51) Int. Cl.
 *H05K 3/02* (2006.01)
(52) U.S. Cl. .................. 29/846; 294/64.1; 294/65; 248/362; 248/363; 269/21; 174/250; 336/200; 430/5; 430/311
(58) Field of Classification Search .............. 294/64.1, 294/65; 248/362, 363; 269/21; 174/250; 336/200; 361/777; 427/96.1–99.5; 430/5, 430/311; 29/846
See application file for complete search history.

(56) References Cited

U.S. PATENT DOCUMENTS

| | | | | |
|---|---|---|---|---|
| 5,261,157 A | * | 11/1993 | Chang | .......................... 29/844 |
| 5,284,287 A | * | 2/1994 | Wilson et al. | ......... 228/180.22 |
| 5,749,614 A | * | 5/1998 | Reid et al. | ................. 294/64.1 |
| 6,158,649 A | | 12/2000 | Miura | |
| 6,202,918 B1 | * | 3/2001 | Hertz | .......................... 228/246 |
| 6,251,767 B1 | * | 6/2001 | Heinen | ....................... 438/616 |
| 6,510,977 B1 | | 1/2003 | Hertz | |
| 6,553,159 B1 | | 4/2003 | Raiti | |
| 6,805,274 B2 | * | 10/2004 | Inoue | ........................... 228/39 |
| 2003/0042287 A1 | | 3/2003 | Inoue | |

FOREIGN PATENT DOCUMENTS

JP   2001298035 A   10/2001

\* cited by examiner

*Primary Examiner*—Peter Vo
*Assistant Examiner*—Michael T Hess
(74) *Attorney, Agent, or Firm*—Todd M. C. Li

(57) ABSTRACT

A vacuum controlled fixture is provided for positioning columns on sites of an electronic substrate. The fixture includes an internal chamber having spaced apart first and second surfaces extending beneath its principal face. A regular array of column receiving holes extends from the principal face through the first surface of the chamber, and a plurality of vacuum ducts extend from ports in the second surface of the chamber to a vacuum source to evacuate the internal chamber. The ports in the second face of the chamber are laterally offset from the receiving holes in the first face of the chamber to allow seating of the interior ends of the columns on coplanar portions of the rear surface. The ports are preferably centered, equidistant from the closest adjacent receiving holes, thereby providing centering of the columns by means of a vacuum driven air flow around the latter.

2 Claims, 2 Drawing Sheets

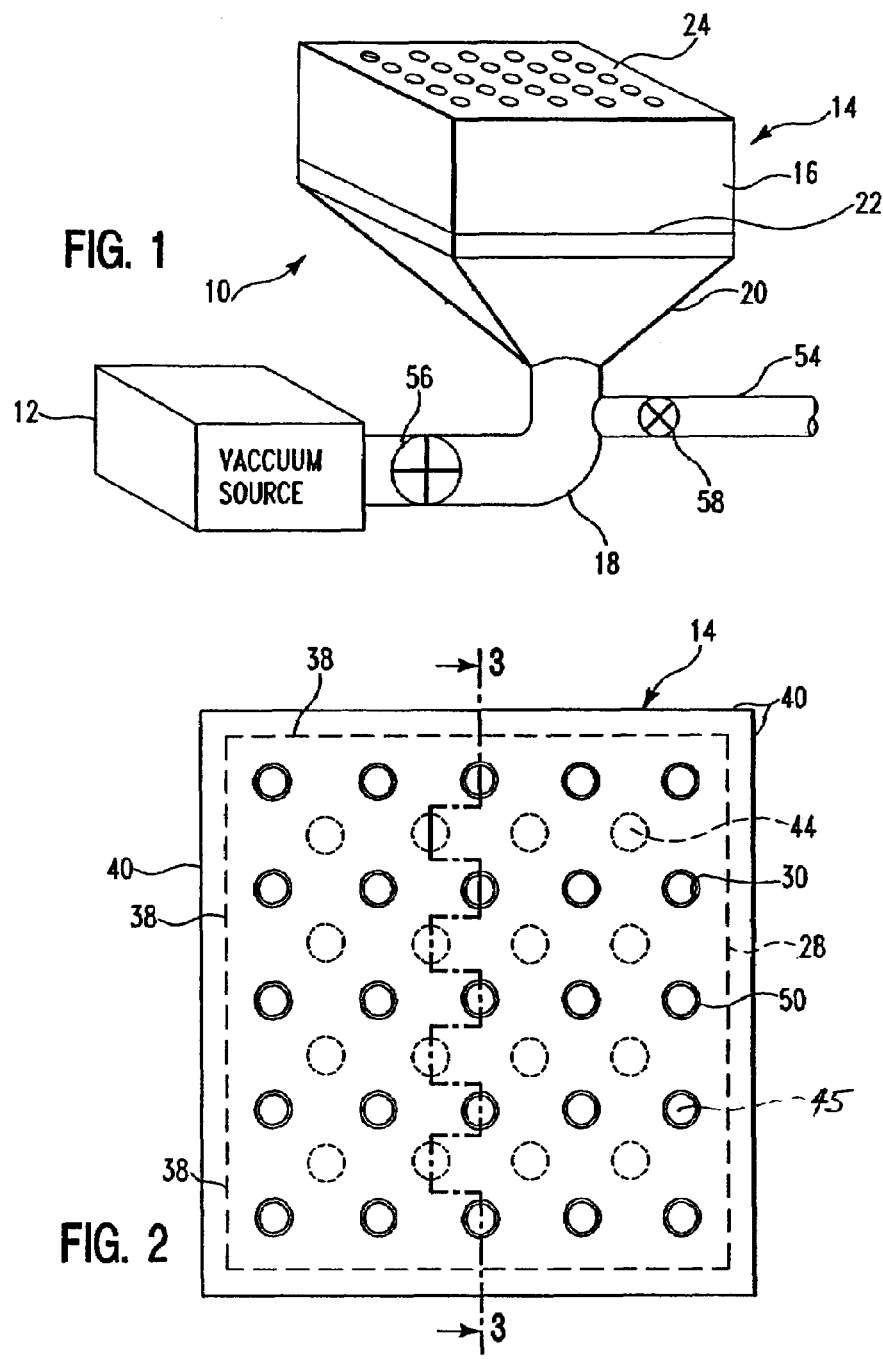

APPARATUS FOR MOUNTING COLUMNS FOR GRID ARRAY ELECTRONIC PACKAGES

FIELD OF THE INVENTION

This invention generally relates to an apparatus for facilitating the mounting of discrete elements on arrayed sites of electronic substrates, components and assemblies in the manufacture of electronic packages, and more particularly relates to a fixture for facilitating the mounting of discrete elements such as solder preforms in a predetermined array on appropriate sites in the manufacture of electronic packages.

BACKGROUND OF THE INVENTION

The increasing complexity and compactness of present day electronic manufacturing provides increased packing density of various elements on semiconductor substrates and other electronic assemblies, such that a need exists for apparatus for holding and aligning preforms and especially preforms in the form of elongated elements, such as columns, or pins or the like, to facilitate appropriate mounting of these elements on similarly arrayed sites of an electronic component such as a substrate or package.

In the prior art, various devices for positioning discrete elements, such as solder balls, on electronic substrates have been provided. Typical of such arrangements, are devices which employ a vacuum for securing solder balls in a predetermined array in apertures of a principal face of a fixture for subsequent engagement of the solder balls with conductive pads, or other sites, on an electronic assembly.

In these prior art arrangements, the apparatus applies a vacuum to the fixture to provide a suction to secure a plurality of solder balls within apertures on a principal face of the fixture in an array that is complementary to select sites on an electronic substrate. Then, the fixture is appropriately positioned over the substrate with its arrayed solder balls essentially touching the selected sites of the electronic assembly, and subsequently upon termination of the vacuum, the solder balls are released from the fixture to their respective sites.

While the above noted arrangements are well utilized in the construction of electronic devices, they still suffer from various disadvantageous. That is, as electronic assemblies continue to increase in complexity, additional needs such as more compact substrates and board designs are also required. With these requirements, users also simultaneously demand ever smaller and more portable devices that not only retain the capacity of larger devices but also provide increased capabilities. Hence, to meet these needs and demands, the packing density of electronic assemblies continues to rapidly increase. And as to be expected, with both increased capacity requirements and miniaturization, still ever greater burdens are placed upon the density and compactness of sites such as conductive pads on electronic substrates.

In order to satisfy this ever increasing density of sites on electronic substrates, an ever higher degree of precision is required in the placement of discrete elements, and especially elongated elements such as columns or pins on the substrate sites. In the prior art, solder balls are often rigidly held by the applied vacuum within conical or stepped apertures in the fixture's principal face. However, the discontinuities resulting from these conical or stepped apertures often result in offsetting, and in many cases, jamming of the preforms in their receiving apertures.

Moreover, such discontinuities often trap debris which, in turn, will contribute to offsetting or jamming of the solder in their receiving apertures. These problems not only effect the precise positioning of the preforms in the fixture's array but, in addition to termination of the vacuum, often also require application of other mechanical forces to drive the tightly held solder balls from the fixture.

In turn, the difficulties of the above noted devices are further complicated where columns, including rods, pins, or other elongated preforms, rather than ball shaped preforms are utilized for mounting on electronic assemblies. For example, debris trapped in a conical, or stepped end of a column receiving hole can not only result in tipping and possible jamming of the column, but also can provide considerable variation in the relative position of their exterior ends.

SUMMARY OF THE INVENTION

Broadly, the invention comprises an apparatus utilizing a unique fixture having a pair of major faces for holding a plurality of preforms, particularly preforms in the form of elongated elements such as columns or pins or the like. A first one of the major faces, hereinafter referred to as the principal face of the fixture, in response to application of a vacuum to an internal chamber, positioned in the interior of the fixture, positions and holds the elongated elements in arrayed apertures on the principal face for mounting on respective arrayed sites on an electronic substrate.

The internal chamber is in the interior of the fixture beneath the principal face and the other major surface, hereinafter referred to as the secondary face of the fixture, and is bounded by a first or upper surface, a second or lower surface and side walls. The first or upper and second or lower surfaces of the chamber are preferably substantially parallel to one another. The principal face of the fixture has arrayed thereon a plurality of holes that extend into and pass through the first or upper surface of the internal chamber. These holes are for receiving the columns, i.e., the elongated elements. One or more vacuum ducts also pass into the chamber to provide for communication between an exterior vacuum source and the chamber for applying a vacuum to the chamber while permitting unimpeded seating of the interior ends of the columns on solid, smooth or uninterrupted portions of the second or lower surface of the chamber.

In the preferred embodiment, there are a plurality of vacuum ducts formed in and passing from the secondary surface of the fixture into the chamber. Each of these ducts are positioned on the secondary surface of the fixture and each passes through the second or lower surface of the chamber at a respective position that is laterally offset, or laterally displaced with respect to where a column receiving hole passes through the first or upper surface of the chamber. These vacuum ducts are connected to an external vacuum. Advantageously, this arrangement provides for undisturbed, uncluttered or uninterrupted regions on the second or lower surface of the chamber opposite to where each column receiving hole passes through the first or upper surface of the chamber to provide for unimpeded seating of the interior ends of the columns on the second or lower surface of the chamber. This lateral displacement of entrance of the vacuum ducts with respect to the receiving holes, as above described, increases the uniformity of vacuum applied to the receiving holes which not only improves loading of the columns but also provides for an air flow for centering the columns in their receiving holes and further provides a stable region against which the column can rest.

Accordingly, it is an object of the present invention to provide a apparatus for holding a plurality of preforms in a predetermined array by means of a vacuum operated fixture and for mounting such preforms on similarly arrayed sites of electronic assemblies for affixing thereto.

Another object of the invention is to provide a unique fixture adapted and configured for placement of an array of elongated preforms for positioning on appropriate sites of an electronic assembly.

Still another object of the invention is to provide a vacuum controlled, column arranging fixture, configured for providing a generally uniform vacuum to its column receiving holes.

Still another object of the invention is to provide a unique vacuum controlled fixture having an internal chamber adapted and configured for holding an array of columns such that each column in the array will have an end coplanar to and seated on or abutted against a solid or uninterrupted portion of a second or lower surface of the chamber.

It is a further object of the present invention to provide a column arranging fixture providing a relatively uniform vacuum for maintaining a plurality of columns in an appropriate array in the fixture.

It is a still further object of the invention to provide a column arranging fixture for providing an air flow for centering each column within its receiving hole.

It is a still further object of the invention to provide a column arranging fixture configured for securing at least a given plurality of columns with their exterior ends in a substantially coplanar association for mounting to an electronic substrate.

These and other objects and features of the present invention will become further apparent from the following description taken in conjunction with the drawings.

BRIEF DESCRIPTION OF THE DRAWINGS

FIG. 1 is a diagrammatic view in perspective of a column mounting apparatus utilizing a fixture provided in accordance with the invention for facilitating the mounting of columns on an electronic assembly;

FIG. 2 is an enlarged plan view of the principal face of the fixture illustrated in FIG. 1;

DESCRIPTION OF THE PREFERRED EMBODIMENTS

Figure 3:
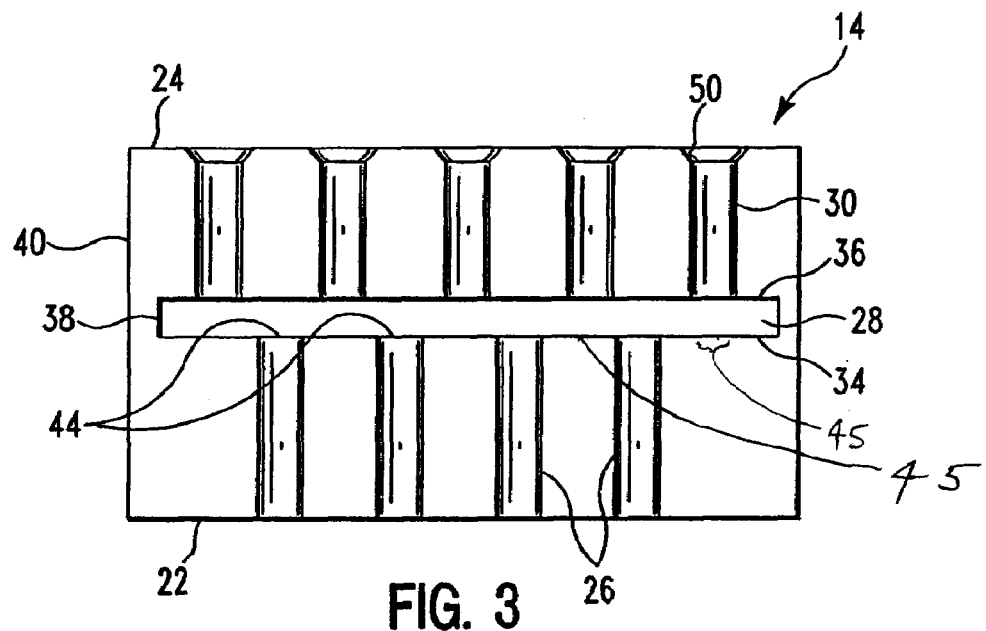
FIG. 3 is a cross sectional view of the column arranging fixture of the invention taken along the lines 3-3 of FIG. 2.
Figure 4:
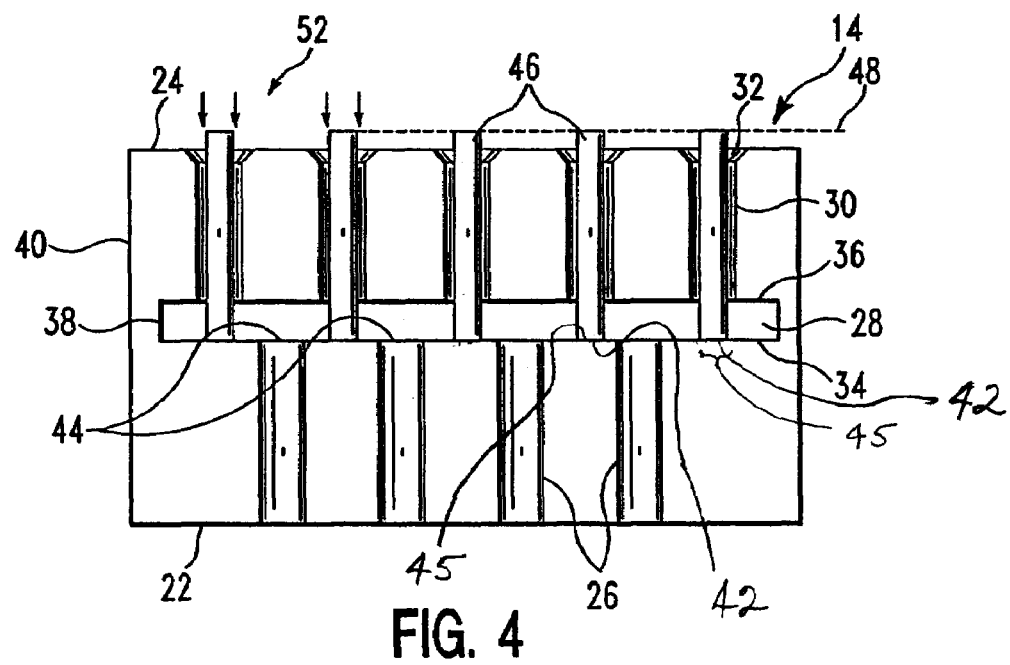
FIG. 4 is the view of the column arranging fixture illustrated in FIG. 3, but shown loaded with a plurality of columns held therein.

The preferred embodiment will now be described, with regard to the figures which are not necessarily drawn to scale, where FIG. 1 is a diagrammatic view in perspective of a column mounting apparatus utilizing a fixture provided in accordance with the invention for facilitating the mounting of columns on an electronic assembly;

FIG. 2 is an enlarged plan view of the principal face of the fixture illustrated in FIG. 1;

FIG. 3 is a cross sectional view of the column arranging fixture of the invention taken along the lines 3-3 of FIG. 2; and FIG. 4 is the view of the column arranging fixture illustrated in FIG. 3, but shown loaded with a plurality of columns held therein.

The apparatus of the present invention is shown in FIGS. 1 to 4 and is comprised of a vacuum source 12 for application of a vacuum to a column arranging fixture 14. For simplicity, the fixture 14 is illustrated here as a parallelepiped having two major, spaced apart opposed, substantially parallel faces, i.e., a principal face 24 and a secondary face 22, which are spaced apart by vertical walls 40. Although these figures show the major surfaces as being generally square or rectangular, other various shapes, e.g., circular, would be suitable as will later be explained. Further, the vacuum source 12 is a conventional vacuum source and is coupled to the fixture 14 through a pipe or passageway 18 and a large exterior manifold 20 which is affixed, in turn to the secondary face 22 of the fixture 14 by any suitable vacuum tight means known to the art.

Additionally, as shown more clearly in FIGS. 3 and 4, the fixture 14 carries, in its interior an internal chamber 28 which extends between and is substantially parallel to the two spaced apart, major surfaces 24 and 22. As shown in the FIGS. 2-4, the internal chamber 28 is also a parallelepiped and extends across a major portion of the fixture 14. This chamber 28 is thus bounded by a major first or upper surface 36, a major second or lower surface 34 and side walls 38, which are located adjacent the exterior side walls 40 of the fixture.

It should also be noted that the height of the internal chamber 28 is exaggerated for clarity in FIGS. 3 and 4. Preferably, the first or upper surface 36 and second or lower surface 34 of the chamber are nominally spaced apart but a small distance; e.g., in the order of 0.005 inches in the preferred embodiment. Further, although the major surfaces 34 and 36 of the chamber are preferably substantially parallel to each other as shown in the figures and to the major faces 22, 24 of the fixture 14, it should be understood that the major second or lower surface of the chamber can be figured, e.g., the second or lower surface 34 can be provided with spaced apart levels or mesas having different heights.

In the preferred embodiment, and as shown in FIGS. 3 and 4 and later explained in more detail with regard thereto, the secondary face 22 of the fixture 14 carries a plurality of vacuum ducts 26 for delivering a vacuum to the internal chamber. The principal face 24 of the fixture 14, in turn, includes a plurality of column receiving holes 30, which pass from face 24 of the fixture 14 into the chamber 28 via its first or upper surface 36 and are configured for receiving the columns 32, a few of which are illustrated in FIG. 4. Further, as shown in FIGS. 2-4, each of the receiving holes 30 includes a beveled entrance aperture 50 at the principal face 24 to facilitate loading of the columns 32 into the receiving holes 30.

The vacuum ducts 26 pass from the secondary surface 22 of fixture 14 into the chamber 28 via the second or lower surface 34 of the chamber 28. The openings or ports 44 created by the ducts penetrating the second or lower surface 34 of the chamber 28 are shown in FIG. 2 in dotted outline. As illustrated in this figure, these openings or ports 44 are in the form of an array similar to that of the receiving holes 30, but the position of each port 44 is laterally offset, or laterally displaced from where the receiving hole 30 enter the chamber on its first or upper surface 36. Thus a solid, rigid, unobstructed and uninterrupted region 45 exists on the second or lower surface 34 of the chamber directly beneath each hole 30.

Thus, in the preferred embodiment, each of the ports 44 is laterally displaced on the second or lower chamber surface 34 around the region 45. Stated otherwise, the position of each port 44 is positioned on the second or lower surface 34 of the chamber 28 such that it is not directly below a receiving hole 30 but is respectively offset, or laterally displaced on the second or lower surface 34 of the internal chamber 28 such each port 44 is equidistant from any receiving hole 30 immediately surrounding the position of the port. This lateral displacement of each port 44 with respect to their nearby holes 30 is clearly depicted in FIGS. 2-4.

It should be understood that, not only are the ports 44 disposed on the second or lower surface 34 whereas the receiving holes 30 end at the first or upper surface 36, the ports 44 and the holes 30 are also separated vertically by the height of side walls 38 of the internal chamber 28, thus they are not located in the same horizontal plane. Moreover because each of the ports 44 are laterally displaced from immediately below the holes 30, as illustrated in FIG. 4, any column 32 loaded in a hole 30, in the fixture 14, will find its interior end 42 seated on a solid, unobstructed and uncluttered region or land 45 on the second or lower surface 34 of the chamber 28.

To recap, there are clear advantages provided by this lateral displacement of the ports 44 relative to where the adjacent receiving holes 30 enter the first or upper surface of the chamber. Thus, this lateral displacement of the ports 44 on the second or lower surface 34 provides adjacent portions 45 on the second or lower surface 34 beneath each receiving hole 30 and these portions 45 form rigid, coplanar, clean, flat, undisturbed, uncluttered and uninterrupted seating areas in the fixture 14 where the interior end 42 of a respective column 32 may rest.

Also, because the columns 32 are preferably of substantially equal length, the exterior ends 46 of these equal length columns will also be substantially coplanar. Hence, with the columns 32 being of a select length and the second or lower surface 34 of the chamber 28 being parallel to the principal face 24, the exterior ends 46 of the columns 32 will define a plane, designated as dotted line 48 in FIG. 4, parallel to and just slightly beyond the principal face 24. As is to be expected, in the preferred embodiment, the columns are all of a select length, equal to the distance from the principal face 24 to the chamber's second or lower surface 34 plus an added nominal distance, for example 0.002 inch, so as to cause each column positioned in a hole to extend a nominal distance of 0.002 inches beyond the principal face 24.

Further, the lateral displacement of the ports 44 relative to the receiving holes 30, and particularly their equidistant relative position with respect to adjacent receiving holes, aids in delivering and maintaining a substantially uniform vacuum at the adjacent receiving holes 30 that facilitates the centering of columns 32 loaded in the receiving holes 30 by the vacuum drawing a generally consistent air flow around the entire diameter of each loaded column 32. Additionally, these conditions also enhance loading of the columns for they help maintain an adequate suction at already loaded receiving holes 30 even though nearby receiving holes are not yet loaded with their columns.

To accommodate the centering of each of the columns 32, in each respective hole 30, via the air flow around them, each of the columns 32 are preferably designed to have a diameter slightly less than the diameter of the receiving holes 30, for example, a 0.002 inch nominal difference in diameter. For example, the columns 32 are designed to 0.010 inch nominal diameter whereas the column receiving holes 30 are designed to 0.012 inch nominal diameter; with a ±0.005 inch tolerance for each. This provides an average 0.002 inch nominal difference in clearance between them, or that is, a 0.001 inch clearance on all sides of the columns 32 when they are centered in their receiving holes 30.

This 0.001 inch clearance around each of the columns 32 is of some importance, since it allows a vacuum driven air flow, shown for example by arrows 52 in FIG. 4, to pass fully around each column, thereby centering each in its receiving hole 30. This centering in turn, greatly improves the accuracy of the columns relative position in the array of the receiving holes 30 of the fixture 14. Moreover, the use of the noted clearance in conjunction with the vacuum driven air flow moderates the detrimental effects that could occur due to required tolerances in the diameters of the column and its receiving hole, or conversely, allows more latitude in such tolerances.

Additionally, the clearance between the columns 32 and their receiving holes 30, not only allows column centering which improves their precise location in the fixture 14, but at the same time, also reduces the possibility of binding, or locking up, of one or more of the columns 32 in its receiving hole 30.

It should also be noted that a clearance greater than the preferred 0.001 inch clearance on all sides of the columns 32 may allow the columns to tilt off center, whereas less clearance will allow the columns to more readily bind and lock up in their receiving holes 30. Hence, in cooperation with the uniformity of the vacuum, the 0.002 inch difference in diameters between the columns 32 and the receiving holes 30, not only facilitates centering of the columns in their receiving holes, but also allows greater leeway in the diameter tolerances of the columns 32 and their receiving holes 30, and also considerably reduces the possibility of binding of the columns in their receiving holes 30.

For operation of the overall apparatus 10, a vacuum control valve 56, shown in FIG. 1, is located in the vacuum passageway 18 for actuation between an open or closed position, which will, in turn, respectively apply the vacuum to the fixture and its chamber 28, or terminate the vacuum if required. Further, since rapidly decreasing the vacuum within the fixture 14 can be advantageous, the passageway 18 can also be provided with means such as a vent pipe 54 and a vent control valve 58 for venting the chamber 28 to atmospheric pressure when desirable.

In the preferred embodiment, the vacuum ducts 26 are illustrated as straight passageways extending from the secondary face 22 of the fixture 14 to the second or lower surface 34. In actuality such vacuum ducts need not be straight and need not enter the chamber 28 solely via the second or lower surface 22. Of course, to apply the vacuum to the internal chamber 28, the external manifold 20 and its operational vacuum would still have to be applied to that portion of the fixture 14 where the exterior ends of any vacuum duct actually emerges. Stated otherwise, what is broadly required is that one or more vacuum ducts extend from an exterior portion of the fixture 14 into communication with the internal chamber 28 to apply a vacuum to the internal chamber while leaving undisturbed at least select regions of the lower surface 34 of the internal chamber 28 which underlie the columns to thereby provide clear, uncluttered surface portions 45 for unimpeded seating of the interior ends 42 of the columns on that surface.

While the fixture can be employed in any number of ways, it is utilized in the preferred embodiment with the principal face 24 oriented face up as shown in FIG. 1. As noted previously, the secondary surface 22 of the fixture 14 is affixed to the external manifold 20 by any suitable means, not shown, to deliver a vacuum from the vacuum source 12 via the ducts 26 and the ports 44 to the internal chamber 28 of the fixture. Then the principal face 24 of the fixture is presented, in its face up position shown in FIG. 1, to receive the columns 32 from a tray, chute or conveyor belt, not shown, such that, due to the suction force of the vacuum, the fixture is loaded with a plurality of the columns 32.

Next an electronic substrate, not shown, is placed face down on the fixture's principal face 24, and aligned thereon with low melting temperature solder positioned between the sites of the substrate and the columns 32. Subsequently, the assembled fixture and substrate are then passed through a furnace to melt the low temperature solder and thereby affixing the columns to the substrate's sites. Where the columns are themselves comprised of solder, the operation is finally completed by any suitable means for melting the columns onto the sites of the substrate.

It should also be understood that the entire apparatus 10 can be made maneuverable or the connection between the fixture 14 and its vacuum source 12 made sufficiently flexible, as to allow varied presentations of its principal face 24 to the columns and to the substrate. Moreover, it should also be self evident that the just noted operations, of applying a vacuum to the fixture 14, loading of columns, and alignment of its substrate, etc., can be automatically accomplished.

Furthermore, construction of the fixture 14 may be provided in any number of ways known to the art. For example, the fixture may be machined or otherwise formed as two separate sections (as if cut laterally through the internal chamber 28) and then assembled by any suitable means known to the art to form the complete fixture 14.

It should also be noted that while the fixture 14 is illustrated in the figures as having opposed, essentially square major faces, namely the secondary face 22 and the principal face 24, it should be self evident that the fixture 14 can take a variety of forms. For example, the principal face 24, and the secondary face 22 of the fixture 14 can be circular, rectangular, triangular, concave or convex or of other of shape to accommodate the configuration of the electronic substrate with which it is to be used.

Moreover, since many present day substrates are generally planar units with a circular border, the principal face 24, or at least the column mounting array thereof, may be circular. Further, it should also be understood that regardless of the configuration of the principal face 24, other surfaces, including the secondary face 22 can also be differently configured to accommodate connecting to the external vacuum manifold 20. Thus, the present invention, results in a unique column arranging fixture which, by means of a vacuum, efficiently secures and appropriately aligns a plurality of columns to facilitate positioning of them on appropriate sites of an electronic substrate of high packing density.

This completes the description of the preferred embodiment of the invention. Since changes may be made in the above construction without departing from the scope of the invention described herein, it is intended that all matter contained in the above description or shown in the accompanying drawings shall be interpreted in an illustrative and not in a limiting sense. Thus other alternatives and modifications, will now become apparent to those skilled in the art without departing from the spirit and scope of the invention as set forth in the following claims.

What is claimed is:

1. A fixture for holding a plurality of columns responsive to an applied vacuum and for subsequently positioning the columns on predetermined sites on a substrate, said fixture comprising:

a body having an exterior surface comprising a principal face;

an internal chamber in said body beneath said principal face, said internal chamber having a space bounded by first and second surfaces extending substantially parallel to said principal face;

a plurality of receiving holes extending through said body from said principal face to said first surface of said internal chamber, and said plurality of receiving holes being configured for receiving and seating said columns on underlying portions of said second surface of said internal chamber;

a plurality of vacuum ducts extending respectively from each of a plurality of ports located in said second surface of said internal chamber to said exterior surface of said fixture and to a vacuum source for extracting air from said internal chamber;

wherein each of said receiving holes is positioned over a respective uninterrupted, substantially flat portion of said second surface of said chamber to provide seating for an interior end of the column received therein, and wherein each of said ports in said second surface is laterally displaced with respect to any of said receiving holes in said first surface, and wherein said second surface and said first surface of said internal chamber are spaced apart a relatively small distance as compared to the length of said receiving holes to provide an internal chamber having a height substantially less than the length of said receiving holes to thereby minimize tilting of said columns in their receiving holes.

2. A fixture for holding a plurality of columns responsive to an applied vacuum and for subsequently positioning the columns on predetermined sites on a substrate, said fixture comprising:

a body having an exterior surface comprising a principal face;

an internal chamber in said body beneath said principal face, said internal chamber having a space bounded by first and second surfaces extending substantially parallel to said principal face;

a plurality of receiving holes extending through said body from said principal face to said first surface of said internal chamber, and said plurality of receiving holes being configured for receiving and seating said columns on underlying portions of said second surface of said internal chamber;

a plurality of vacuum ducts extending respectively from each of a plurality of ports located in said second surface of said internal chamber to said exterior surface of said fixture and to a vacuum source for extracting air from said internal chamber, wherein each of said receiving holes is positioned over a respective uninterrupted, substantially flat portion of said second surface of said chamber to provide seating for an interior end of the column received therein, and wherein each of said ports in said second surface is laterally displaced substantially equidistant with respect to the closest adjacent of said receiving holes in said first surface so as to maintain a substantially uniform vacuum at the closest adjacent receiving holes, and wherein said second surface and said first surface of said internal chamber are spaced apart a relatively small distance as compared to the length of said receiving holes to provide an internal chamber having a height substantially less than the length of said receiving holes to thereby minimize tilting of said columns in their receiving holes.

* * * * *